(12) United States Patent
Xu et al.

(10) Patent No.: US 10,908,715 B2
(45) Date of Patent: Feb. 2, 2021

(54) ARRAY SUBSTRATE FOR DETECTING TOUCH POSITION WITH BOTTOM GATE SENSING THIN FILM TRANSISTOR

(71) Applicants: BOE TECHNOLOGY GROUP CO., LTD., Beijing (CN); BEIJING BOE DISPLAY TECHNOLOGY CO., LTD., Beijing (CN)

(72) Inventors: Liyan Xu, Beijing (CN); Junwei Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 344 days.

(21) Appl. No.: 15/544,508

(22) PCT Filed: Feb. 16, 2017

(86) PCT No.: PCT/CN2017/073767
§ 371 (c)(1),
(2) Date: Jul. 18, 2017

(87) PCT Pub. No.: WO2018/014547
PCT Pub. Date: Jan. 25, 2018

(65) Prior Publication Data
US 2018/0267655 A1    Sep. 20, 2018

(30) Foreign Application Priority Data

Jul. 22, 2016 (CN) .......................... 2016 1 0587266

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1368* (2013.01); *G02F 1/13338* (2013.01);
(Continued)

(58) Field of Classification Search
CPC .. G06F 3/0412; G06F 3/0414; G06F 3/04144; G06F 3/04146; G06F 3/047;
(Continued)

(56) References Cited

U.S. PATENT DOCUMENTS 2,898,477 A * 8/1959 Hoesterey ............ H04R 23/006
381/190
3,351,786 A * 11/1967 Muller ................. H01L 29/7849
310/319

(Continued)

FOREIGN PATENT DOCUMENTS

| CN | 103558946 A | 2/2014 |
| CN | 104123021 A | 10/2014 |
| CN | 105974637 A | 9/2016 |

OTHER PUBLICATIONS

PCT International Search Report and Written Opinion, for PCT Patent Application No. PCT/CN2017/073767, dated Mar. 31, 2017, 27 pages.

(Continued)

*Primary Examiner* — Keith L Crawley
(74) *Attorney, Agent, or Firm* — Kinney & Lange, P.A.

(57) ABSTRACT

The disclosure provides an array substrate and a method of manufacturing the same, a display device and a method of detecting a touch position. In the array substrate, the plurality of X and Y sensing lines are respectively parallel to gate data lines, and a sensing thin film transistor is provided at a crossing position where the X and Y sensing lines cross. A control terminal and an output terminal of the sensing thin film transistor are coupled to the X and Y sensing lines, (Continued)

respectively. A piezoelectric material layer is formed between the control terminal and an input terminal of the sensing thin film transistor such that, when being pressed, the piezoelectric material layer generates deformation such that a sensing voltage is generated at the input terminal of the sensing thin film transistor with relative to the control terminal of the sensing thin film transistor.

12 Claims, 6 Drawing Sheets

(51) Int. Cl.
  *G02F 1/1368* (2006.01)
  *G06F 3/047* (2006.01)
  *G02F 1/1362* (2006.01)
  *H01L 41/083* (2006.01)
  *H01L 41/311* (2013.01)
  *H01L 41/113* (2006.01)
  *H01L 41/27* (2013.01)

(52) U.S. Cl.
  CPC ........ *G02F 1/136286* (2013.01); *G06F 3/047* (2013.01); *G06F 3/0414* (2013.01); *H01L 41/083* (2013.01); *H01L 41/1132* (2013.01); *H01L 41/27* (2013.01); *H01L 41/311* (2013.01); *G02F 1/1333* (2013.01); *G02F 2001/133394* (2013.01); *G06F 2203/04103* (2013.01)

(58) Field of Classification Search
  CPC ......... G06F 2203/04103; G02F 1/1333; G02F 1/13338; G02F 1/136286; G02F 1/1368; G02F 2001/133394; G02F 2001/13685; H03K 17/964; H03K 17/9643; H01L 2021/775; H01L 41/08; H01L 41/0825; H01L 41/083; H01L 41/113; H01L 41/1132; H01L 41/25; H01L 41/27; H01L 41/29; H01L 41/293; H01L 41/297; H01L 41/311

See application file for complete search history.

(56) References Cited

U.S. PATENT DOCUMENTS

| | | | | |
|---|---|---|---|---|
| 3,585,415 | A | * | 6/1971 | Muller ............... G01L 1/16 310/319 |
| 4,378,510 | A | * | 3/1983 | Bennett ............. H01L 29/84 257/254 |
| 5,883,419 | A | * | 3/1999 | Lee ................. H01L 45/00 257/245 |
| 6,860,939 | B2 | | 3/2005 | Hartzell |
| 7,125,451 | B2 | | 10/2006 | Hartzell |
| 7,128,783 | B2 | | 10/2006 | Hartzell |
| 7,135,070 | B2 | | 11/2006 | Hartzell |
| 7,156,916 | B2 | | 1/2007 | Hartzell |
| 7,217,588 | B2 | | 3/2007 | Hartzell et al. |
| 7,230,306 | B2 | | 6/2007 | Hartzell |
| 7,253,488 | B2 | | 8/2007 | Zhan et al. |
| 7,341,884 | B2 | | 3/2008 | Hartzell |
| 7,425,749 | B2 | | 9/2008 | Hartzell et al. |
| 7,431,766 | B2 | | 10/2008 | Hartzell |
| 7,569,410 | B2 | | 8/2009 | Hartzell et al. |
| 7,763,947 | B2 | | 7/2010 | Zhan et al. |
| 7,785,912 | B2 | | 8/2010 | Zhan et al. |
| 8,035,164 | B2 | | 10/2011 | Kato |
| 2003/0196590 | A1 | | 10/2003 | Hartzell |
| 2003/0196591 | A1 | | 10/2003 | Hartzell |
| 2003/0196592 | A1 | | 10/2003 | Hartzell |
| 2003/0196593 | A1 | | 10/2003 | Hartzell |
| 2003/0197214 | A1 | | 10/2003 | Hartzell |
| 2003/0199177 | A1 | | 10/2003 | Hartzell |
| 2005/0130360 | A1 | | 6/2005 | Zhan et al. |
| 2005/0153475 | A1 | | 7/2005 | Hartzell |
| 2006/0148137 | A1 | | 7/2006 | Hartzell et al. |
| 2006/0211162 | A1 | | 9/2006 | Hartzell |
| 2007/0023851 | A1 | | 2/2007 | Hartzell et al. |
| 2007/0099327 | A1 | | 5/2007 | Hartzell et al. |
| 2007/0212805 | A1 | | 9/2007 | Hartzell |
| 2007/0278600 | A1 | | 12/2007 | Zhan et al. |
| 2007/0287233 | A1 | | 12/2007 | Zhan et al. |
| 2008/0290384 | A1 | * | 11/2008 | Lolivier ............. H01L 29/516 257/295 |
| 2009/0101986 | A1 | | 4/2009 | Kato |
| 2009/0127977 | A1 | * | 5/2009 | So ................... H01L 27/20 310/322 |
| 2011/0137184 | A1 | * | 6/2011 | Ren ................ G01L 9/0098 600/485 |
| 2014/0191221 | A1 | * | 7/2014 | Benwadih ........... G01L 9/008 257/40 |
| 2014/0362000 | A1 | * | 12/2014 | Seo ................ G02F 1/13394 345/173 |
| 2015/0115331 | A1 | * | 4/2015 | Moon ............... H01L 29/84 257/254 |
| 2016/0274397 | A1 | | 9/2016 | Zhou |
| 2017/0139518 | A1 | * | 5/2017 | Oh ................ G06F 3/0414 |
| 2017/0194427 | A1 | * | 7/2017 | Tian ............... H01L 29/786 |
| 2018/0120938 | A1 | * | 5/2018 | Frescas ............. G06F 1/163 |

OTHER PUBLICATIONS

Xiao, Yu, "PZT Ferroelectrics Thin Films Used in MEMS", Journal of Inorganic Materials, vol. 20 No. 1, dated Jan. 2005, 6 pages.
Author Unknown, "Fabrication and Research and Application of Piezoelectric Materials", dated May 18, 2010.

* cited by examiner

ARRAY SUBSTRATE FOR DETECTING TOUCH POSITION WITH BOTTOM GATE SENSING THIN FILM TRANSISTOR

CROSS-REFERENCE TO RELATED APPLICATIONS

The present application claims priority to Chinese Patent Application No. 201610587266.X, filed on Jul. 22, 2016, entitled "array substrate, method of manufacturing the same, display device and method of detecting touch position", which is incorporated herein by reference in its entirety.

BACKGROUND

1. Technical Field

The present disclosure relates to display technical field, and particularly to an array substrate, a display device and methods of manufacturing the same and a method of detecting a touch position.

2. Description of the Related Art

With development technologies for a liquid crystal display, thinner, lighter and integrated liquid crystal displays are gradually becoming favor of consumers. A conventional built-in touch display device needs a pressure sensing layer to be added into an array substrate, which renders a thickness of the array substrate to be increased and is not favor of thinning and lighting of the display device. In addition, a special structure is required to be manufactured on the array substrate to achieve touch detection, which leads to complex structure.

Thus, it is needed to provide an array substrate and a display device, which occupy a small area of a panel, have a high aperture ratio of pixels, are applicable in a large-size panel, do not increase a thickness of an array substrate and need no additional formation of structure for touch detection.

SUMMARY

The present disclosure provides an array substrate and a method of manufacturing the same, a display device and a method of detecting a touch position.

According to an aspect, there is provided an array substrate including: a plurality of X sensing lines and a plurality of Y sensing lines arranged to cross each other, wherein a sensing thin film transistor is provided at each of at least one of a plurality of crossing positions where the X sensing lines cross the Y sensing lines, wherein a control terminal of the sensing thin film transistor is coupled to a respective one of the X sensing lines and an output terminal of the sensing thin film transistor is coupled to a respective one of the Y sensing lines; a piezoelectric material layer is formed between the control terminal and an input terminal of the sensing thin film transistor such that, when the sensing thin film transistor is pressed, the piezoelectric material layer generates a deformation such that a sensing voltage is generated at the input terminal of the sensing thin film transistor relative to the control terminal of the sensing thin film transistor.

According to another aspect, there is provided a method of manufacturing an array substrate, wherein the array substrate comprises a plurality of pixel units and each of the pixel units comprises a switch thin film transistor, the switch thin film transistor and sensing thin film transistor both have a bottom gate structure; the method comprises: forming control terminals of the sensing thin film transistor and the switch thin film transistor; forming a piezoelectric material layer; forming input terminals and output terminals of the sensing thin film transistor and the switch thin film transistor such that an end of the piezoelectric material layer contacts the control terminal of the sensing thin film transistor and the other end of the piezoelectric material layer contacts the input terminal of the sensing thin film transistor.

According to a still aspect, there is provided a method of manufacturing an array substrate, wherein the array substrate comprises a plurality of pixel units and each of the pixel units comprises a switch thin film transistor, and the switch thin film transistor and sensing thin film transistor both have a top gate structure; the method comprises: forming input terminals and output terminals of the sensing thin film transistor and the switch thin film transistor; forming a piezoelectric material layer; and forming control terminals of the sensing thin film transistor and the switch thin film transistor such that one end of the piezoelectric material layer contacts the control terminal of the sensing thin film transistor and the other end of the piezoelectric material layer contacts the input terminal (105) of the sensing thin film transistor.

According to an aspect, there is provided a display device including: a color filter substrate and any one of the above the array substrates; wherein the array substrate is spaced apart from the color filter substrate by a plurality of spacers, an orthographic projection of the piezoelectric material layer of the sensing thin film transistor on a plane where the array substrate is located overlaps an orthographic projection of the spacers on the plane where the array substrate is located.

According to a further aspect, there is provided a method of manufacturing a display device, the method comprising: manufacturing an array substrate according to the method of any one of the above methods; forming a black matrix, a color filter film layer, a protective layer and a liquid crystal alignment layer in sequence on a substrate, and forming a spacer at a position of the liquid crystal alignment layer corresponding to the black matrix, to form a color filter substrate; assembling the array substrate and the color filter substrate such that an orthographic projection of the piezoelectric material layer on a plane where the array substrate is located overlaps an orthographic projection of the spacer on the plane where the array substrate is located.

According to a last aspect, there is provided a method of detecting a touch position for use with the above display device, the method comprising: loading a scanning signal onto the X sensing line; when the scanning signal on the X sensing line that is coupled to the sensing thin film transistor corresponding to the touch position is a turn-on voltage, the sensing voltage on the input terminal of the sensing thin film transistor is transferred to the output terminal and the Y sensing line of the sensing thin film transistor such that the voltage value on the Y sensing line changes relative to a standard voltage value; determining the Y sensing line on which the voltage value changes in response to detecting the change of the voltage value on the Y sensing line, and recording the time when the voltage value on the Y sensing line changes; determining the X sensing line, which corresponds to the time when the voltage value on the Y sensing line changes, the scanning signal on the X inducing line at the time when the voltage value on the Y sensing line changes is the turn-on voltage; and determining the crossing position, where the Y sensing line on which the voltage value changes crosses the X sensing line corresponding to the time when the voltage value on the Y sensing line changes, to be the touch position.

DETAILED DESCRIPTION OF THE EMBODIMENTS

In order to clearly and definitely illustrate objects, technical schemes and advantages of the present disclosure, a further description in detailed on the present disclosure is made by combination with exemplary embodiments with reference to the drawings.

Figure 1:
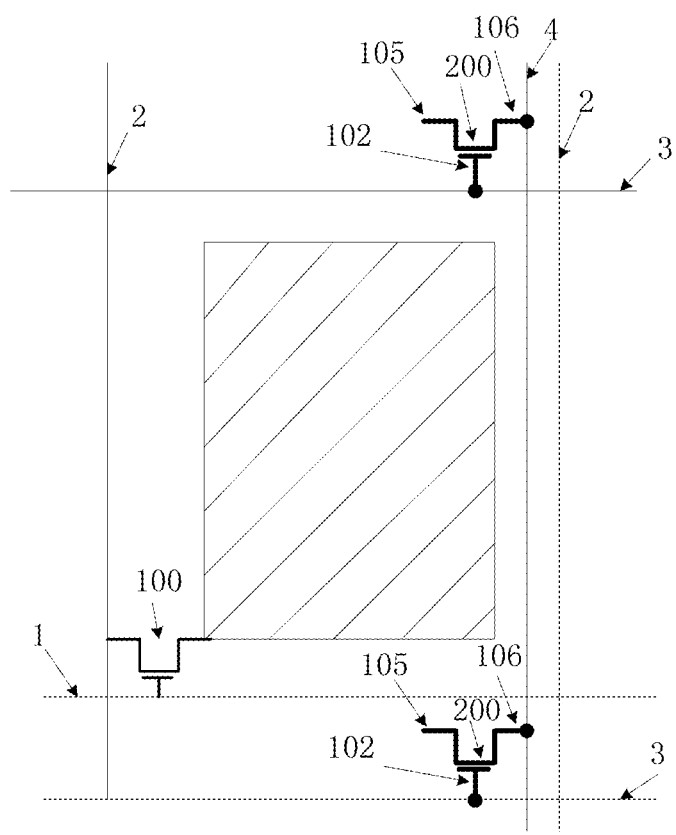
FIG. 1 is a structural schematic view of an array substrate according to an embodiment of the present disclosure.

As shown in FIG. 1, an array substrate is provided according to an embodiment of the present disclosure, including: a plurality of gate lines 1 and a plurality of data lines 2, a plurality of pixel units being defined between the gate lines 1 and the data lines 2 and each pixel unit including a switch thin film transistor 100 and a pixel electrode; the array substrate further includes a plurality of X sensing lines 3 and a plurality of Y sensing lines 4, the X sensing lines 3 and the Y sensing lines 4 being respectively parallel to the gate lines 1 and the data lines 2, a sensing thin film transistor 200 being provided at a crossing position where the X sensing line crosses the Y sensing line, wherein a control terminal 102 of the sensing thin film transistor is coupled to the X sensing line 3 and an output terminal 106 of the sensing thin film transistor is coupled to the Y sensing line 4; a piezoelectric material layer 108 is formed between the control terminal 102 and an input terminal 105 of the sensing thin film transistor such that, when the sensing thin film transistor 200 is pressed, the piezoelectric material layer 108 generates deformation such that a sensing voltage is generated at the input terminal 105 with relative to the control terminal 102.

In an example, the control terminal 102 of the sensing thin film transistor is directed to a gate of the sensing thin film transistor, the input terminal 105 of the sensing thin film transistor is directed to a source electrode of the sensing thin film transistor, the output terminal 106 of the sensing thin film transistor is directed to a drain electrode of the sensing thin film transistor, and the source electrode and the drain electrode of the sensing thin film transistor may be interchanged.

In the embodiment, at all crossing positions where the X sensing lines and the Y sensing lines cross one another are provided the sensing thin film transistors 200, that is, each pixel unit corresponds to one sensing thin film transistor 200. In other words, each pixel unit corresponds to a minimum touch region that can be detected and a touch sensing resolution is thus equal to a pixel resolution of the array substrate, thereby obtaining a very high touch sensing resolution and a touch detection accuracy. Alternatively, at only parts of the crossing positions where the X sensing lines and the Y sensing lines cross one another are provided the sensing thin film transistors 200, that is, only parts of the pixel units correspond to respective sensing thin film transistor 200. Several pixel units correspond to a minimum touch region that can be detected, which is applicable in situations where requirements for the touch sensing resolution are not high and which may simplify structure of the array substrate and reduce material cost.

In an embodiment, an orthographic projection of the sensing thin film transistor on a plane where the array substrate is located and an orthographic projection of the pixel electrode on the plane where the array substrate is located are staggered each other, thereby the sensing thin film transistor 200 making no influence on light transmission of the pixel electrode and display effect.

Further, a control terminal of the switch thin film transistor is coupled to the gate line 1, an input terminal of the switch thin film transistor is coupled to the data line 2, an output terminal of the switch thin film transistor is coupled to the pixel electrode, both the sensing thin film transistor 200 and the switch thin film transistor 100 are of bottom gate thin film transistor or top gate thin film transistor, and each layer of the sensing thin film transistor has the same material and thickness as a corresponding layer of the switch thin film transistor, thereby a thickness of the array substrate will not be increased due to providing the sensing thin film transistor 200, which facilitates thinning of the array substrate.

In an example, the control terminal of the switch thin film transistor is directed to a gate of the switch thin film transistor, the input terminal of the switch thin film transistor is directed to a source electrode of the switch thin film transistor, the output terminal of the switch thin film transistor is directed to a drain electrode of the switch thin film transistor, and the source electrode and the drain electrode of the switch thin film transistor may be interchanged.

Figure 2:
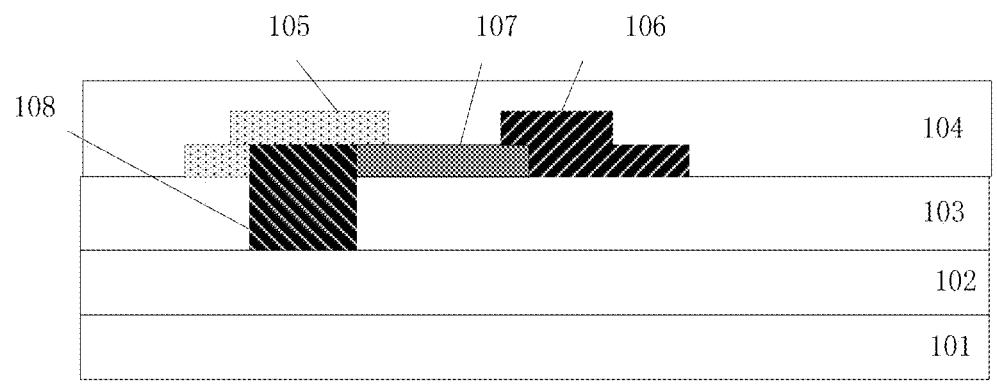
FIG. 2 is a structural schematic view of an array substrate, provided with a sensing thin film transistor with a bottom gate structure, according to an embodiment of the present disclosure.

Further, in situation where the switch thin film transistor 100 of the pixel unit is a bottom gate thin film transistor, as shown in FIG. 2, the sensing thin film transistor 200 is also a bottom gate thin film transistor. In the array substrate in this embodiment, the sensing thin film transistor 200 specifically includes: the control terminal 102 formed on a substrate 101; a gate insulating layer 103 formed over the control terminal 102 and having a first through hole therein; an active layer 107 formed on the gate insulating layer; a piezoelectric material layer 108 formed in the first through hole of the gate insulating layer; an output terminal 106 formed on the gate insulating layer 103 and lapping over the active layer 107; and, an input terminal 105 formed on the gate insulating layer 103 and lapping over the active layer and the piezoelectric material layer, and a passivation layer 104 formed over the active layer, the input terminal and the output terminal.

Figure 3:
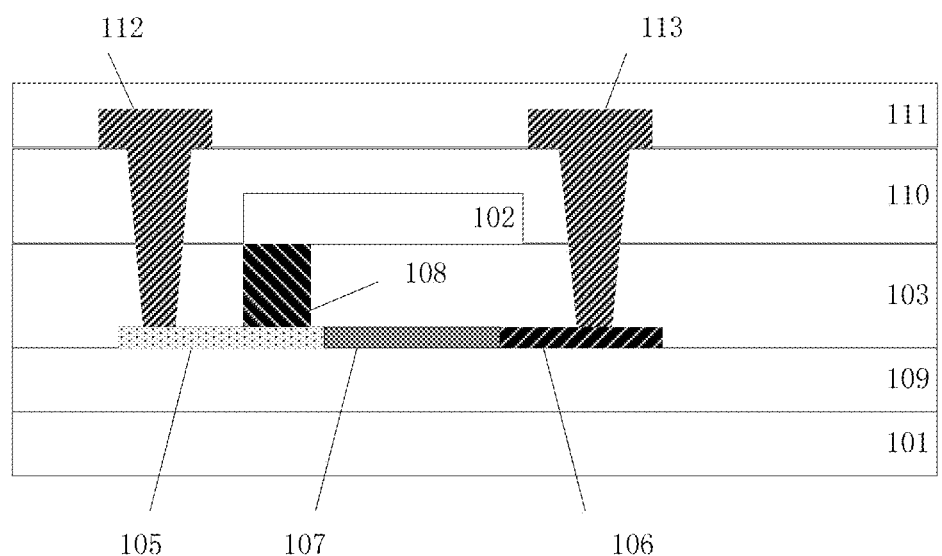
FIG. 3 is a structural schematic view of an array substrate, provided with a sensing thin film transistor with a top gate structure, according to an embodiment of the present disclosure.

In situation where the switch thin film transistor 100 of the pixel unit is a top gate thin film transistor, as shown in FIG. 3, the sensing thin film transistor 200 is also a top gate thin film transistor. The array substrate in this embodiment further includes: a substrate 101, and a sensing thin film transistor 200. The sensing thin film transistor 200 specifically includes: a buffer layer 109 formed on the substrate 101; an input terminal 105, an output terminal 106 and an active layer 107 formed on the buffer layer; a gate insulating layer 103 formed over the active layer, the input terminal and the output terminal and having a second through hole at a position corresponding to the input terminal; a piezoelectric material layer 108 formed on the input terminal in the second through hole of the gate insulating layer; the control terminal 102 formed on the gate insulating layer and the piezoelectric material layer; an interlayer deposition layer 110 formed over the control terminal and the gate insulating layer, both the gate insulating layer and the interlayer deposition layer 110 having the third through holes therein and the corresponding third through holes in the gate insulating layer and the interlayer deposited layer 110 being communicated to each other, and an input terminal electrode 112 and an output terminal electrode 113 being formed in and led out of the third through hole, i.e., the input terminal electrode 112 is coupled to the input terminal 105 and passes through the third through hole to outside of the third through hole, and the output terminal electrode 113 is coupled to the output terminal 106 and passes through the third through hole to outside of the third through hole; and, a planarization layer 111 formed on the interlayer deposition layer.

The sensing thin film transistor 200 and the switch thin film transistor 100 have the same type of thin film transistor structure, and may be manufactured in the same process synchronously without additional process for manufacturing the sensing thin film transistor, thereby simplifying process procedure and reducing cost.

In an embodiment, the piezoelectric material layer 108 is made of one selected from a piezoelectric crystal, a piezoelectric ceramic, a piezoelectric polymer or a composite material of a piezoelectric ceramic and a piezoelectric polymer.

In the array substrate of the above embodiments of the present disclosure, the sensing thin film transistor is provided and the piezoelectric material layer 108 is provided between the control terminal 102 and the input terminal 105 of the sensing thin film transistor, that is, a first end of the piezoelectric material layer is coupled to the control terminal 102 of the sensing thin film transistor and a second end, opposite to the first end, of the piezoelectric material layer is coupled to input terminal 105 of the sensing thin film transistor, the X sensing line 3 is configured to be loaded thereon a scanning signal; when touching, a pressing force generated by touching is transferred to the piezoelectric material layer 108 and the piezoelectric material layer 108 is deformed such that a sensing voltage is generated on the input terminal 105 of the sensing thin film transistor. In this time, if the scanning signal on the X sensing line is a turn-on voltage, the sensing thin film transistor 200 is turned on and the sensing voltage on the input terminal of the sensing thin film transistor is transferred to the output terminal 106 of the sensing thin film transistor, and outputted to the Y sensing line 4. The voltage value on the Y sensing line thus changes with relative to a standard voltage. The Y sensing line at a position where touch occurs and the corresponding X sensing line at the time when the voltage value is changing may be determined by detecting change of the voltage value, and the crossing position where the X sensing line crosses the Y sensing line is determined as a touch position.

In the array substrate according to an embodiment of the present disclosure, the sensing thin film transistor is provided to achieve sensing of a touch position. With relative to a conventional in-cell touch display device, such as a photo sensitive switch of a photosensitive touch substrate, and a conductive pad of a resistance touch substrate, the sensing thin film transistor occupies a reduced area, renders reduced opacity area of the array substrate, increased aperture ratio, and enhanced display effect, and is adapted to large-size panel. Further, the piezoelectric material layer 108 is located within the sensing thin film transistor and thus neither increases thickness of the sensing thin film transistor nor renders thickness of the array substrate to be increased, facilitating thinning of the display device.

Figure 6:
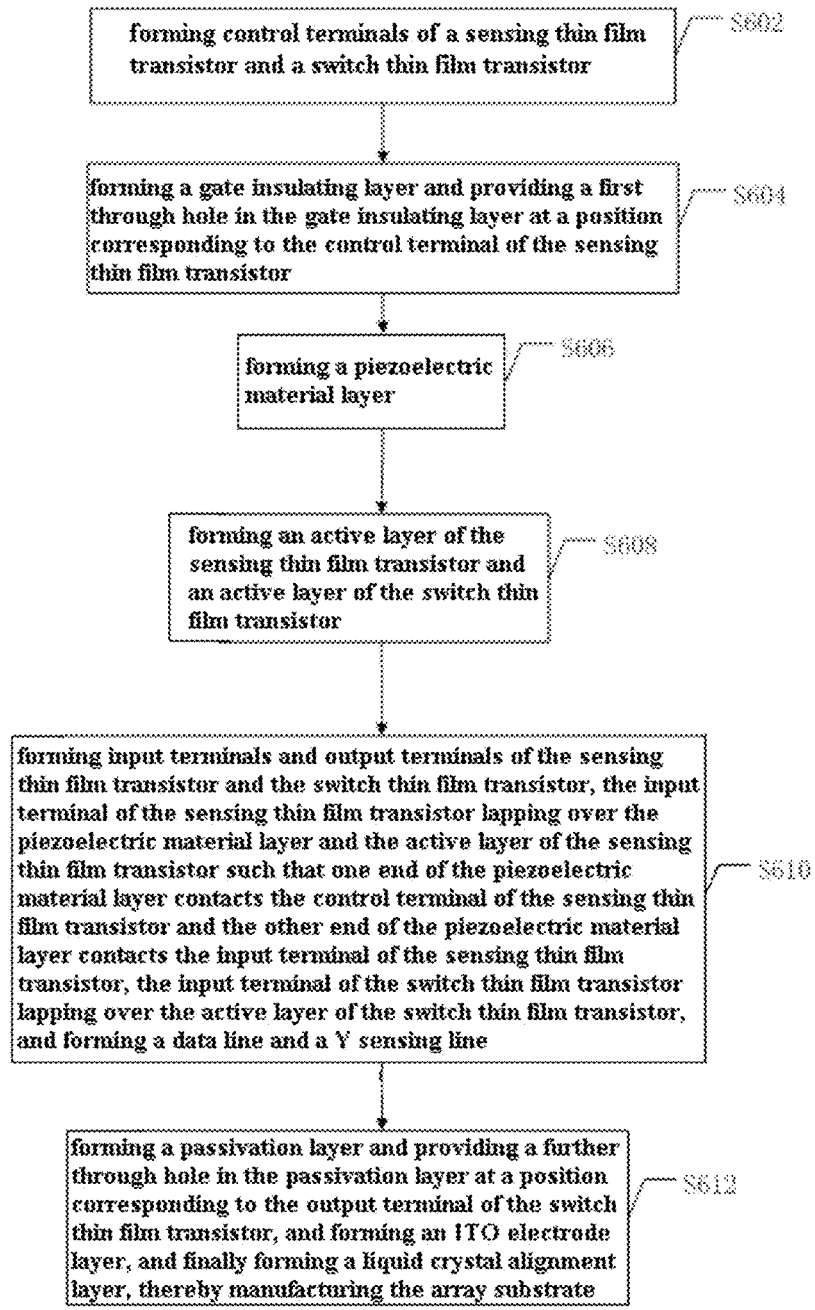
FIG. 6 is flow chart of a method of manufacturing an array substrate having a sensing thin film transistor with a bottom gate structure according to an embodiment of the present disclosure.

Another embodiment of the present disclosure provides a method of manufacturing an array substrate, which is adapted for a sensing thin film transistor of a bottom gate structure. As shown in FIG. 6, the method includes:

step S602: forming control terminals of a sensing thin film transistor and a switch thin film transistor.

Step S602 specifically includes: forming a metal material film on a substrate 101, and obtaining a control terminal 102 of the sensing thin film transistor and a control terminal of the switch thin film transistor that are patterned through a patterning process, and forming a gate line 1 and an X sensing line 3.

In an embodiment, the method further comprises forming an ITO film on the substrate 101 and obtaining a pattern including an ITO electrode layer through a patterning process, which is adaptable for an ADS display device.

Step S604: forming a gate insulating layer 103 and providing a first through hole in the gate insulating layer 103 at a position corresponding to the control terminal 102 of the sensing thin film transistor.

Step S606: forming a piezoelectric material layer 108, which specifically includes: forming a piezoelectric material film at the first through hole, and obtaining the piezoelectric material layer 108 that is patterned through a patterning process.

Step S608: forming an active layer 107 of the sensing thin film transistor and an active layer of the switch thin film transistor.

Step S610: forming input terminals and output terminals of the sensing thin film transistor and the switch thin film transistor, the input terminal 105 of the sensing thin film transistor lapping over the piezoelectric material layer 108 and the active layer 107 of the sensing thin film transistor such that one end of the piezoelectric material layer contacts the control terminal 102 of the sensing thin film transistor and the other end of the piezoelectric material layer contacts the input terminal 105 of the sensing thin film transistor, the input terminal of the switch thin film transistor lapping over the active layer of the switch thin film transistor, and forming a data line 2 and a Y sensing line 4.

Step S612: forming a passivation layer 104 and providing a further through hole in the passivation layer at a position corresponding to the output terminal of the switch thin film transistor, and forming an ITO electrode layer, and finally forming a liquid crystal alignment layer 114, thereby manufacturing the array substrate.

In an embodiment, the piezoelectric material layer 108 is formed from a ferroelectric film PZT which may withstand at a temperature from 400 to 500 degrees, or a piezoelectric ceramic material which may withstand at a temperature from 200 to 300 degrees.

Figure 7:
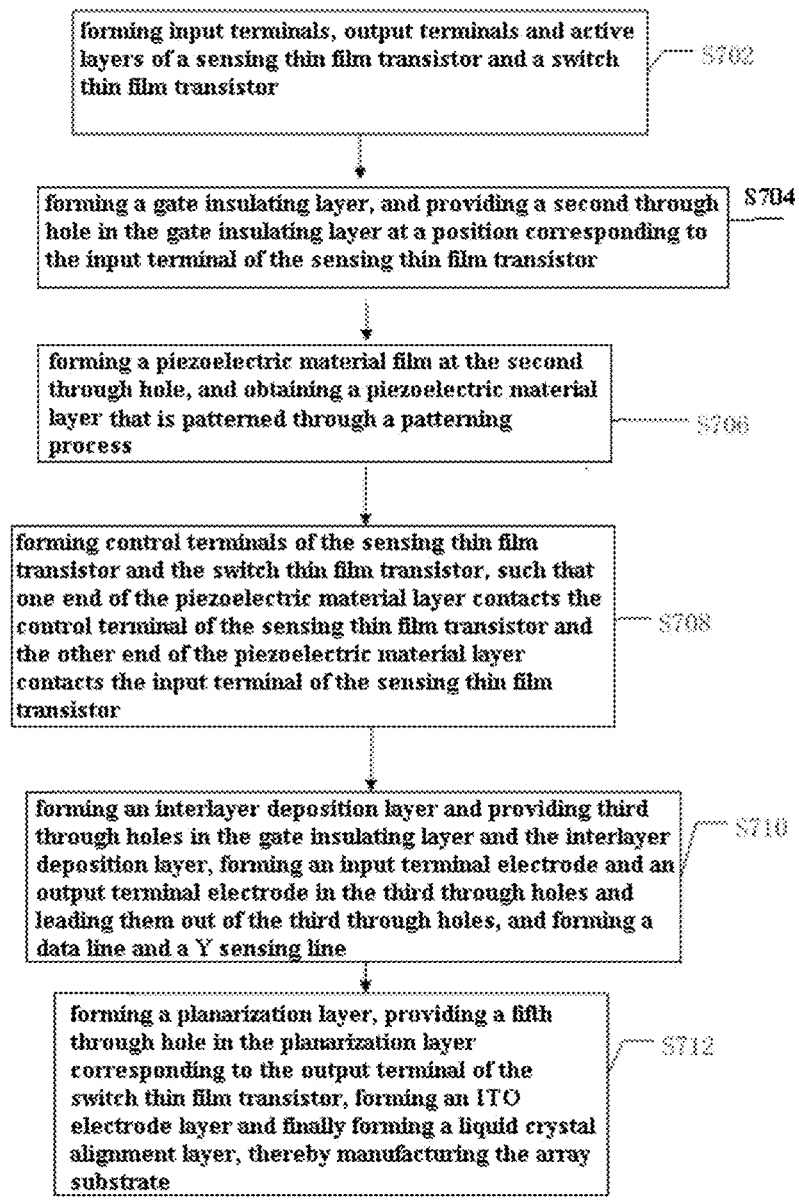
FIG. 7 is flow chart of a method of manufacturing an array substrate having a sensing thin film transistor with a top gate structure according to an embodiment of the present disclosure.

A still embodiment of the present disclosure provides a method of manufacturing the above array substrate, which is adapted for a sensing thin film transistor of a top gate structure. As shown in FIG. 7, the method includes:

Step S702: forming input terminals, output terminals and active layers of a sensing thin film transistor and a switch thin film transistor.

In an embodiment, before step S702, the method may further comprises a step of forming a buffer layer, and in step S702, the input terminal, the output terminal and the active layer of the sensing thin film transistor and the switch thin film transistor are formed on the buffer layer.

Step S704: forming a gate insulating layer 103, and providing a second through hole in the gate insulating layer 103 at a position corresponding to the input terminal of the sensing thin film transistor.

Step S706: forming a piezoelectric material film at the second through hole, and obtaining a piezoelectric material layer 108 that is patterned through a patterning process.

Step S708: forming control terminals of the sensing thin film transistor and the switch thin film transistor, such that one end of the piezoelectric material layer contacts the control terminal 102 of the sensing thin film transistor and the other end of the piezoelectric material layer contacts the input terminal 105 of the sensing thin film transistor;

Step S710: forming an interlayer deposition layer 110 and providing third through holes in the gate insulating layer and the interlayer deposition layer 110 such that a respective through hole in the gate insulating layer is communicated with a corresponding one in the interlayer depositing layer 110, forming an input terminal electrode 112 and an output terminal electrode 113 in the third through holes and leading them out of the third through holes, i.e., the input terminal electrode 112 is coupled to the input terminal 105 and passes through the third through hole to outside of the third through hole, and the output terminal electrode 113 is coupled to the output terminal 106 and passes through the third through hole to outside of the third through hole, and forming a data line 2 and a Y sensing line 4;

Step S712: forming a planarization layer 111, providing a fifth through hole in the planarization layer corresponding to the output terminal of the switch thin film transistor, forming an ITO electrode layer and finally forming a liquid crystal alignment layer 114, thereby manufacturing the array substrate.

In an embodiment, the piezoelectric material layer 108 is formed from a ferroelectric film PZT which may withstand at a temperature from 400 to 500 degrees, or a piezoelectric ceramic material which may withstand at a temperature from 200 to 300 degrees.

The method according to the embodiments of the present disclosure may be performed to form the sensing thin film transistor and the switch thin film transistor synchronously in the same process procedure without additional process for forming the sensing thin film transistor, thereby simplifying process and reducing cost.

Figure 4:
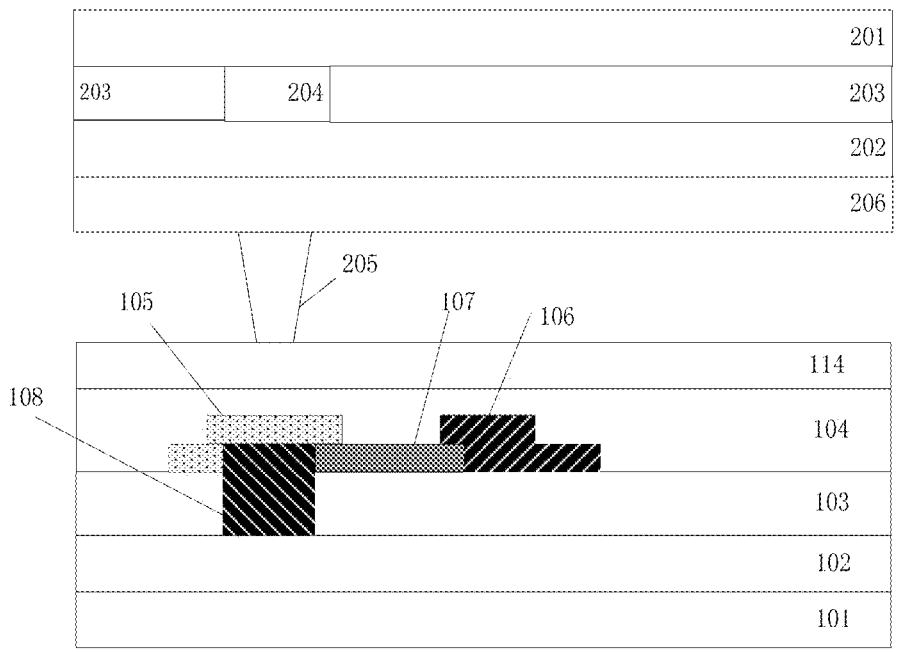
FIG. 4 is a structural schematic view of a display device having a sensing thin film transistor with a bottom gate structure according to an embodiment of the present disclosure.
Figure 5:
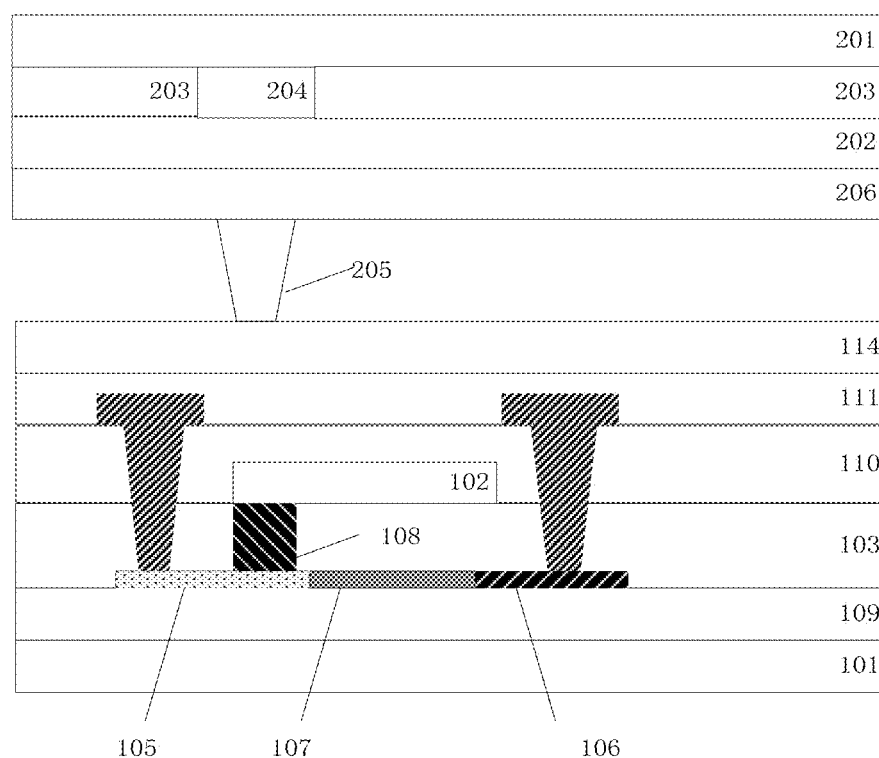
FIG. 5 is a structural schematic view of a display device having a sensing thin film transistor with a top gate structure according to an embodiment of the present disclosure.

Another embodiment of the present disclosure provides a display device comprising the above array substrate and a color filter substrate, the color filter substrate including a substrate 201, a color filter film layer 203, black matrixes 204, a protective layer 202, spacers 205 and a liquid crystal alignment layer 206, wherein positions of the spacers 205 correspond to positions of the black matrixes 204 respectively, the array substrate is spaced from the color filter substrate by the spacers 205 and after assembling the color filter substrate and the array substrate in a cell, an orthographic projection of the piezoelectric material layer 108 of the sensing thin film transistor on a plane where the array substrate is located overlaps an orthographic projection of the spacers 205 on the plane where the array substrate is located. FIG. 4 illustrates a display device including the sensing thin film transistor of a bottom gate structure and FIG. 5 illustrates display device including the sensing thin film transistor of a top gate structure.

Exemplarily, the orthographic projection of the piezoelectric material layer 108 of the sensing thin film transistor in the array substrate on the plane where the array substrate is located is located within the orthographic projection of the spacers on the plane where the array substrate is located.

In an embodiment, when touching, a pressing force generated by touch is transferred to the piezoelectric material layer by the spacers such that the piezoelectric material layer is deformed. As the spacers contact the color filter substrate and the array substrate, the pressing force of touch, even it is slight, may be easily transferred to the piezoelectric material layer by the spacers, thereby increasing sensitivity for touch. Further, the spacer belong to a conventional structure in a liquid crystal panel, thus without manufacturing special protrusion structures, the touch sensitivity may be improved, the structure of the color filter substrate and manufacturing process therefor are simplified, and the material cost is reduced.

Figure 8:
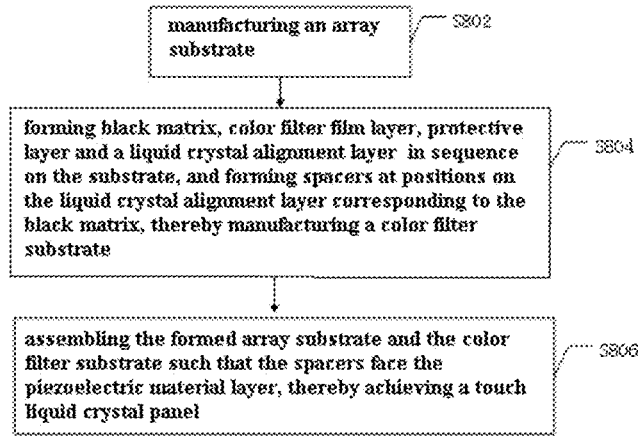
FIG. 8 is a flow chart of a method of manufacturing a display device according to an embodiment of the present disclosure.

A further embodiment of the present disclosure provides a method of manufacturing a display device, as shown in FIG. 8, the method including:

Step S802: manufacturing an array substrate;

Wherein, the array substrate may be manufactured by the method of any one of the above embodiments.

Step S804: forming black matrix 204, a color filter film layer 203, a protective layer 202 and a liquid crystal alignment layer 206 in sequence on the substrate 201, and forming spacers 205 at positions on the liquid crystal alignment layer corresponding to the black matrix, thereby manufacturing a color filter substrate.

Step S806: assembling the formed array substrate and the color filter substrate such that the spacers 205 face the piezoelectric material layer 108, thereby achieving a touch liquid crystal panel.

In an embodiment, after assembling the array substrate and the color filter substrate, an orthographic projection of the piezoelectric material layer 108 on a plane where the array substrate is located overlaps an orthographic projection of the spacers on the plane where the array substrate is located.

Exemplarily, an orthographic projection of the piezoelectric material layer 108 of the sensing thin film transistor in the array substrate on the plane where the array substrate is located is located within an orthographic projection of the spacers on the plane where the array substrate is located, in order to ensure the piezoelectric material is completely used.

It is noted that processes of forming films or film layers include deposition, coating and sputtering, etc., and the patterning process generally includes photoresist coating, exposure, development, etching, photoresist peeling-off, etc.

A still embodiment of the present disclosure provides a display device further including: a touch drive unit and a touch sensing unit.

The touch drive unit is configured to be coupled to the X sensing lines 3 and load a scanning signal to the X sensing lines 3 line by line. A turn-on voltage of the scanning signal starts at a known time, and when the voltage value of the scanning signal on the X sensing line, which is coupled to the sensing thin film transistor corresponding to the touch position, is equal to the turn-on voltage, the sensing thin film transistor is turned on.

The touch sensing unit is coupled to the Y inducting line 4. When the sensing thin film transistor corresponding to the touch position is turned on, the sensing voltage on the input terminal of the sensing thin film transistor is transferred to the output terminal 106, and outputted to the Y sensing line. As the voltage value on the Y sensing line changes with relative to a standard voltage, the touch sensing unit detects the change on the Y sensing line, and determines the Y sensing line on which the voltage value changes, and records the time when the voltage value on the Y sensing line changes;

The X sensing line, on which the scanning signal at the time when the voltage value on the Y sensing line changes is the turn-on voltage, is determined, and a crossing position where the Y sensing line on which the voltage value changes crosses the X sensing line, on which the scanning signal at the time when the voltage value on the Y sensing line changes is the turn-on voltage, is determined as a touch position.

The display device according to the embodiment is configured to determine the Y sensing line at a pressing position by comparing the sensing voltage and the standard voltage by the touch sensing unit, and determine the touch position in combination with the scanning signal on the X sensing line, and the touch sensing unit needs no complex circuit structure and thus the circuit structure is simplified.

In an embodiment, the touch drive unit and the touch sensing unit are integrated on a single chip and thus circuit structure is further simplified and circuit cost is further reduced.

Figure 9:
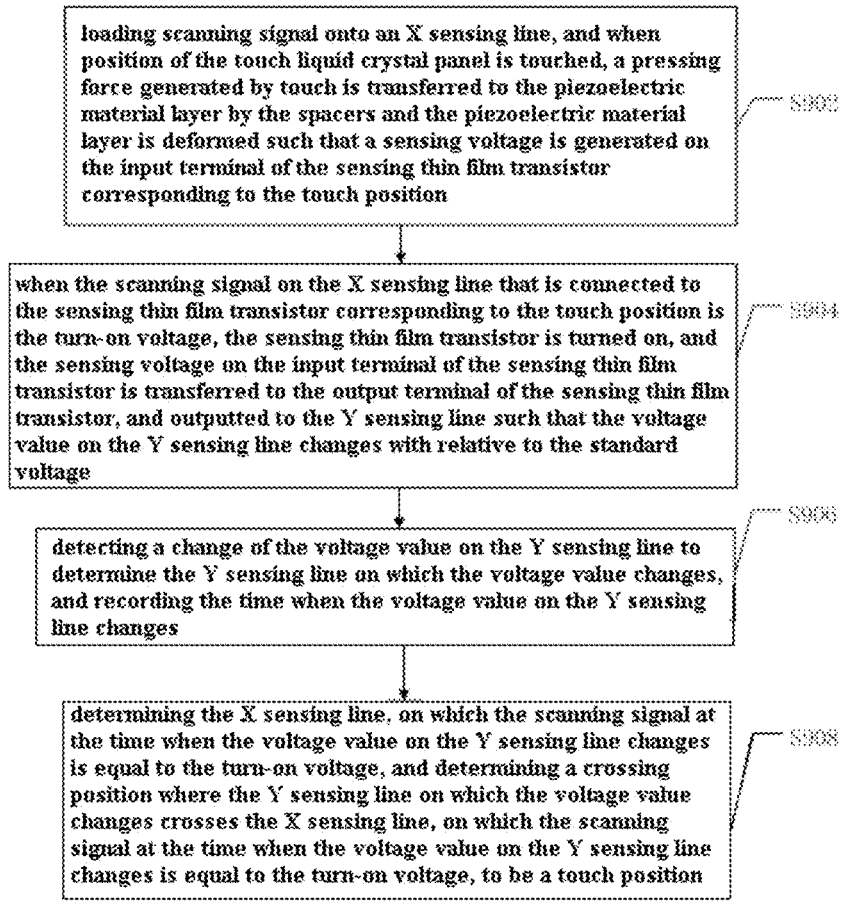
FIG. 9 is a flow chart of a method of detecting a touch position according to an embodiment of the present disclosure.

An embodiment of the present disclosure provides a method of detecting a touch position, as shown in FIG. 9, the method including:

Step S902: loading a scanning signal onto an X sensing line 3, and when a position of the touch liquid crystal panel is touched, a pressing force generated by touch is transferred to the piezoelectric material layer 108 by the spacers 205 and the piezoelectric material layer 108 is deformed such that a sensing voltage is generated on the input terminal 105 of the sensing thin film transistor corresponding to the touch position;

Step S904: when the scanning signal on the X sensing line that is connected to the sensing thin film transistor corresponding to the touch position is equal to the turn-on voltage, the sensing thin film transistor is turned on, and the sensing voltage on the input terminal of the sensing thin film transistor is transferred to the output terminal 106 of the sensing thin film transistor, and outputted to the Y sensing line such that the voltage value on the Y sensing line changes with relative to the standard voltage.

Specifically, the X sensing line 3 is loaded with the progressive scanning signal and the turn-on voltage of the scanning signal starts at a known time. When the scanning signal on the X sensing line connected to the sensing thin film transistor that corresponds to the touch position is equal to the turn-on voltage, the sensing thin film transistor is turned on, and the sensing voltage on the input terminal of the sensing thin film transistor is transferred to its output terminal 106, and outputted to the Y sensing line such that the voltage value on the Y sensing line changes with relative to the standard voltage.

Step S906: detecting a change of the voltage value on the Y sensing line to determine the Y sensing line on which the voltage value changes, and recording the time when the voltage value on the Y sensing line changes;

Step S908: determining the X sensing line, on which the scanning signal at the time when the voltage value on the Y sensing line changes is equal to the turn-on voltage, and determining a crossing position where the Y sensing line on which the voltage value changes crosses the X sensing line, on which the scanning signal at the time when the voltage value on the Y sensing line changes is equal to the turn-on voltage, to be a touch position.

The embodiments of the present disclosure are described in detailed in combination with the drawings. According to the above description, those skilled in the art can clearly understand the array substrate, the touch liquid crystal panel and the display device.

It is noted that all other embodiments that are not described in the text or illustrated in the drawings are known by those skilled in the art and are not described in detailed. In addition, definitions about the above components are not limited to the various special structures, shapes or formations that are presented in the above embodiments, and can be simply replaced or modified by those skilled in the art. For example:

(1) The piezoelectric material layer may also be formed from other material;
(2) The orientations in the embodiments, such as "top", "bottom", "front", "rear", "left", "right", etc., are merely directions defined with relative to the drawings, but do not tend to limit the scope of the present disclosure;
(3) The above embodiments may be combined or arranged therewith or with other embodiments for use based on consideration of design and reliability, that is, the technical features in different embodiments may be freely combined to obtain more embodiments.

The above embodiments tend to illustrate the object, technical schemes and advantages of the present disclosure in detailed. It is understood that the above contents are merely exemplary embodiments of the present disclosure, but are not used for limiting the present disclosure, and any modification, equivalent replacement and improvement that fall within the inspiration and principle of the present disclosure shall be included in the protective scope of the present invention.

What is claimed is:

1. An array substrate comprising:
a plurality of X sensing lines and a plurality of Y sensing lines arranged to cross each other, wherein a sensing thin film transistor is provided at each of at least one of a plurality of crossing positions where the X sensing lines cross the Y sensing lines;
wherein a control terminal of the sensing thin film transistor is coupled to a respective one of the X sensing lines and an output terminal of the sensing thin film transistor is coupled to a respective one of the Y sensing lines; a piezoelectric material layer is formed between the control terminal and an input terminal of the sensing thin film transistor such that the piezoelectric material layer is electrically connected with the control terminal and an input terminal, and when the sensing thin film transistor is pressed, the piezoelectric material layer generates a deformation such that a sensing voltage is generated at the input terminal of the sensing thin film transistor relative to the control terminal of the sensing thin film transistor;
wherein the control terminal of the sensing thin film transistor is directed to the gate of the sensing thin film transistor, the input terminal of the sensing thin film transistor is directed to the drain electrode of the sensing thin film transistor, and the output terminal of the sensing thin film transistor is directed to the source electrode of the sensing thin film transistor;
wherein the sensing thin film transistor is a bottom gate thin film transistor; and
wherein the sensing thin film transistor comprises:
the control terminal formed on a substrate of the array substrate;
a gate insulating layer formed over the control terminal and having a first through hole therein;
an active layer formed on the gate insulating layer;
a piezoelectric material layer formed in the first through hole;
the output terminal formed on the gate insulating layer and lapping over the active layer; and
the input terminal formed on the gate insulating layer and lapping over the active layer and the piezoelectric material layer;
wherein the control terminal of the sensing thin film transistor is a gate of the sensing thin film transistor, the output terminal is one of a source electrode and a drain electrode of the sensing thin film transistor and the input terminal is the other of the source electrode and the drain electrode of the sensing thin film transistor; and
wherein an end of the piezoelectric material layer is in direct contact with the control terminal of the sensing thin film transistor and the other end of the piezoelectric material layer is in direct contact with the input terminal of the sensing thin film transistor.

2. The array substrate according to claim 1, further comprising a plurality of pixel units each comprising a pixel electrode, wherein an orthographic projection of the sensing thin film transistor on a plane where the array substrate is located and an orthographic projection of the pixel electrode on a plane where the array substrate is located are staggered each other.

3. The array substrate according to claim 2, wherein each pixel unit further comprises a switch thin film transistor;
the switch thin film transistor is a bottom gate thin film transistor; and
each layer of the sensing thin film transistor has the same material and thickness as a respective layer in the switch thin film transistor.

4. The array substrate according to claim 2, further comprising a plurality of gate lines and a plurality of data lines, the X sensing lines and the Y sensing lines being respectively parallel to the gate lines and the data lines; and
the plurality of pixel units are respectively located at regions that are surrounded by the gate lines and the data lines, wherein each pixel unit corresponds to one sensing thin film transistor, or a plurality of the pixel units that are adjacent to one another correspond to one sensing thin film transistor.

5. The array substrate according to claim 1, wherein the piezoelectric material layer is made of a material selected from a piezoelectric crystal, a piezoelectric ceramic, a piezoelectric polymer or a composite material of a piezoelectric ceramic and a piezoelectric polymer.

6. A method of manufacturing an array substrate, wherein the array substrate comprises a sensing thin film transistor and a plurality of pixel units and each of the pixel units comprises a switch thin film transistor, and the switch thin film transistor and the sensing thin film transistor both have a bottom gate structure;
the method comprises:
forming control terminals of the sensing thin film transistor and the switch thin film transistor;
forming a piezoelectric material layer; and
forming input terminals and output terminals of the sensing thin film transistor and the switch thin film transistor such that an end of the piezoelectric material layer is in direct contact with the control terminal of the sensing thin film transistor and the other end of the piezoelectric material layer is in direct contact with the input terminal of the sensing thin film transistor,
wherein the control terminal of the sensing thin film transistor is a gate of the sensing thin film transistor, the output terminal is one of a source electrode and a drain electrode of the sensing thin film transistor and the input terminal is the other of the source electrode and the drain electrode of the sensing thin film transistor;
wherein, the method further comprises, between the step of forming the control terminals of the sensing thin film transistor and the switch thin film transistor and the step of forming the piezoelectric material layer, forming a gate insulating layer, and providing a first through hole at a position of the gate insulating layer corresponding to the control terminal of the sensing thin film transistor;
wherein the forming the piezoelectric material layer comprises: forming a piezoelectric material film in the first through hole and obtaining the piezoelectric material layer of each sensing thin film transistor that is patterned through a patterning process;
wherein the method further comprises, between the step of forming the piezoelectric material layer and the step of forming the input terminals and the output terminals of the sensing thin film transistor and the switch thin film transistor, forming an active layer of the sensing thin film transistor and an active layer of the switch thin film transistor; and
wherein the forming the input terminals and the output terminals of the sensing thin film transistor and the switch thin film transistor comprises: forming the input terminal and the output terminal of the sensing thin film transistor and the input terminal and the output terminal of the switch thin film transistor, the input terminal of the sensing thin film transistor lapping over the piezoelectric material layer and the active layer of the sensing thin film transistor and the input terminal of the switch thin film transistor lapping over the active layer of the switch thin film transistor; and, forming a data line and a Y sensing line.

7. A display device comprising: a color filter substrate, and the array substrate according to claim 1;
wherein the array substrate is spaced apart from the color filter substrate by a plurality of spacers, an orthographic projection of the piezoelectric material layer of the sensing thin film transistor on a plane where the array substrate is located overlaps an orthographic projection of the spacers on the plane where the array substrate is located.

8. The display device according to claim 7, further comprising: a touch drive unit and a touch sensing unit; wherein:
the touch drive unit is coupled to the X sensing line and is configured to load a scanning signal onto the X sensing line, and the touch sensing unit is coupled to the Y sensing line; and
the touch sensing unit comprises:
a Y sensing line determination module configured to determine the Y sensing line on which a voltage value changes, in response to a change of the voltage value on the Y sensing line, and record a time when the voltage value on the sensing line changes;

a X sensing line determination module configured to determine the X sensing line, which corresponds to the time when the voltage value on the Y sensing line changes, the scanning signal on the X sensing line at the time when the voltage value on the Y sensing line changes is a turn-on voltage; and a position determination module configured to determine a crossing position, where the Y sensing line on which the voltage value changes crosses the X sensing line that corresponds to the time when the voltage value on the Y sensing line changes, to be a touch position.

9. The display device according to claim 8, wherein the touch drive unit and the touch sensing unit are integrated in a single chip.

10. A method of manufacturing a display device, the method comprising:

manufacturing an array substrate according to the method of claim 6;

forming a black matrix, a color filter film layer, a protective layer and a liquid crystal alignment layer in sequence on a substrate, and forming a spacer at a position of the liquid crystal alignment layer corresponding to the black matrix, to form a color filter substrate;

assembling the array substrate and the color filter substrate such that an orthographic projection of the piezoelectric material layer on a plane where the array substrate is located overlaps an orthographic projection of the spacer on the plane where the array substrate is located.

11. A method of detecting a touch position for use with the display device according to claim 7, the method comprising:

loading a scanning signal onto the X sensing line;

when the scanning signal on the X sensing line that is coupled to the sensing thin film transistor corresponding to the touch position is a turn-on voltage, the sensing voltage on the input terminal of the sensing thin film transistor is transferred to the output terminal and the Y sensing line of the sensing thin film transistor such that the voltage value on the Y sensing line changes relative to a standard voltage value;

determining the Y sensing line on which the voltage value changes in response to detecting the change of the voltage value on the Y sensing line, and recording the time when the voltage value on the Y sensing line changes;

determining the X sensing line, which corresponds to the time when the voltage value on the Y sensing line changes, the scanning signal on the X inducing line at the time when the voltage value on the Y sensing line changes being the turn-on voltage; and determining the crossing position, where the Y sensing line on which the voltage value changes crosses the X sensing line corresponding to the time when the voltage value on the Y sensing line changes, to be the touch position.

12. The array substrate as claimed in claim 1, wherein the piezoelectric material layer is in direct contact with a side surface of the active layer.

* * * * *